(12) United States Patent
Tzeng et al.

(10) Patent No.: US 8,012,836 B2
(45) Date of Patent: Sep. 6, 2011

(54) SEMICONDUCTOR DEVICES AND METHODS FOR FABRICATING THE SAME

(75) Inventors: Kuo-Chyuan Tzeng, Hsinchu (TW); Jian-Yu Shen, Yunlin (TW); Kuo-Chi Tu, Hsinchu (TW); Kuo-Ching Huang, Hsinchu (TW); Chin-Yang Chang, Hsinchu (TW)

(73) Assignee: Taiwan Semiconductor Manufacuturing Co., Ltd., Hsin-Chu (TW)

( * ) Notice: Subject to any disclaimer, the term of this patent is extended or adjusted under 35 U.S.C. 154(b) by 442 days.

(21) Appl. No.: 11/528,405

(22) Filed: Sep. 28, 2006

(65) Prior Publication Data

US 2008/0079050 A1 Apr. 3, 2008

(51) Int. Cl.
*H01L 27/108* (2006.01)
*H01L 21/8242* (2006.01)

(52) U.S. Cl. ........ 438/279; 257/296; 257/306; 257/402; 257/E21.66; 257/E21.648; 257/E21.646; 257/E21.645; 438/238; 438/253; 438/289; 438/290; 438/291

(58) Field of Classification Search .................. 257/296, 257/306, E21.019, 402, 288, E21.66, E21.648, 257/E21.646, E21.645, E21.615, E21.602, 257/E21.599; 438/238, 253–256, 381, 396–399, 438/286, 289, 290, 291
See application file for complete search history.

(56) References Cited

U.S. PATENT DOCUMENTS

| 5,780,902 | A | * | 7/1998 | Komuro | 257/344 |
| 6,187,619 | B1 | * | 2/2001 | Wu | 438/224 |
| 6,417,547 | B2 | * | 7/2002 | Kang | 257/369 |
| 6,548,842 | B1 | * | 4/2003 | Bulucea et al. | 257/288 |
| 6,620,679 | B1 | | 9/2003 | Tzeng et al. | |
| 6,949,783 | B2 | | 9/2005 | Ahn | |
| 7,006,370 | B1 | | 2/2006 | Ramesh et al. | |
| 7,037,776 | B2 | | 5/2006 | Huang et al. | |
| 2002/0074569 | A1 | * | 6/2002 | Taniguchi et al. | 257/200 |
| 2003/0173625 | A1 | * | 9/2003 | Choi | 257/369 |
| 2004/0232462 | A1 | * | 11/2004 | Takeuchi | 257/296 |
| 2007/0080387 | A1 | * | 4/2007 | Liu et al. | 257/303 |

* cited by examiner

*Primary Examiner* — A. Sefer
*Assistant Examiner* — Ermias Woldegeorgis
(74) *Attorney, Agent, or Firm* — Birch, Stewart, Kolasch & Birch, LLP (57) ABSTRACT

Semiconductor devices and methods for fabricating the same are provided. An exemplary embodiment of a semiconductor device comprises a substrate with a plurality of isolation structures formed therein, defining first and second areas over the substrate. A transistor is formed on a portion of the substrate in the first and second areas, respectively, wherein the transistor in the second area is formed with merely a pocket doping region in the substrate adjacent to a drain region thereof. A first dielectric layer is formed over the substrate, covering the transistor formed in the first and second areas. A plurality of first contact plugs is formed through the first dielectric layer, electrically connecting a source region and a drain region of the transistor in the second area, respectively. A second dielectric layer is formed over the first dielectric layer with a capacitor formed therein, wherein the capacitor electrically connects one of the first contact plugs.

6 Claims, 9 Drawing Sheets

SEMICONDUCTOR DEVICES AND METHODS FOR FABRICATING THE SAME

BACKGROUND

The invention generally relates to semiconductor fabrication, and particularly to semiconductor memory devices providing improved memory performance within a high density memory layout.

Recently, system-on-chip (SoC) technology provides reduced development cycle time while increasing product functionality, performance and quality. SoC technology allows placement of multiple function "subsystems" on a single semiconductor chip. The various types of subsystems that may be integrated within the semiconductor chip include microprocessor and micro-controller cores, digital signal processors (DSPs), memory blocks, communication cores, sound and video cores, radio frequency (RF) cells, power management, and high-speed interfaces, among others. SoC technology can thus provide customized products for a variety of applications, including low-power, wireless, networking, consumer and high-speed applications.

Typically, integration of memory in SoC technology is complicated due to the incompatibility of memory process with the logic process and a need for larger surface area of the memory cell array. In addition, to address requirements for transistors that are as fast as possible, and thus, have feature sizes as small as possible, many processes employ gate conductors having critical dimension less than 1.0 µm, reducing feature size of resulting transistors. Fabrication of reduced-size transistors in SoC technology allows more transistors to be placed on a substrate, allowing relatively large circuit systems to be incorporated onto single, relatively small semiconductor chips. Moreover, as transistor feature sizes continue to decrease with advancements in manufacturing, more memory cells can be incorporated onto the chip without increasing chip area. In many SoC applications, this may be especially advantageous in increasing on-chip memory, but disadvantageous in increasing memory cell device leakage directed to the size-reduced transistors.

Thus, minimized memory cell device leakages with optimal size-reduction of the transistors is needed.

SUMMARY

Semiconductor devices having optimized relations between the memory cell device leakages and size-reduction of the transistors and methods for fabricating the same are provided.

An exemplary embodiment of a semiconductor device comprises a substrate with a plurality of isolation structures formed therein, defining first and second areas over the substrate. A transistor is formed on a portion of the substrate in the first and second areas, respectively, wherein the transistor in the first area is formed with pocket doping regions in the substrate adjacent to both source/drain regions and the transistor in the second area is formed with merely a pocket doping region in the substrate adjacent to a drain region thereof. A first dielectric layer is formed over the substrate, covering the transistor formed in the first and second areas. A plurality of first contact plugs is formed through the first dielectric layer, electrically connecting a source region and a drain region of the transistor in the second area, respectively. A second dielectric layer is formed over the first dielectric layer with a capacitor formed therein, wherein the capacitor electrically connects one of the first contact plugs.

An exemplary embodiment of a method for fabricating a semiconductor device comprises providing a substrate with a plurality of isolation structures formed therein, defining first and second areas over the substrate. A transistor is formed on a portion of the substrate in the first and second areas, respectively, wherein the transistor in the first third area is formed with pocket doping regions in the substrate adjacent to both source/drain regions and the transistor in the second area is formed with merely a pocket doping region in the substrate adjacent to a drain region thereof. A first dielectric layer is formed over substrate, covering the transistor formed in the first and second areas. A plurality of first contact plugs is formed through the first dielectric layer, electrically connecting a source region and a drain region of the transistor in the second area, respectively. A second dielectric layer is formed over the first dielectric layer. A capacitor is formed in portions of the second dielectric layer in the second area, wherein the capacitor electrically connects one of the first contact plugs.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DESCRIPTION

Semiconductor devices and methods for fabricating the same are described here in detail. Some embodiments of the invention, such as the exemplary embodiments described, can potentially reduce memory cell leakage during incorporation of reduced-size transistors. In some embodiments, this can be accomplished by optimizing doping regions of reduced-size transistors formed in a memory cell area of a SoC semiconductor device to thereby reduce undesired P/N junctions.

FIGS. 1 to 9 are cross-sections illustrating portions of a substrate during fabrication of a semiconductor device according to an exemplary embodiment.

Figure 1:
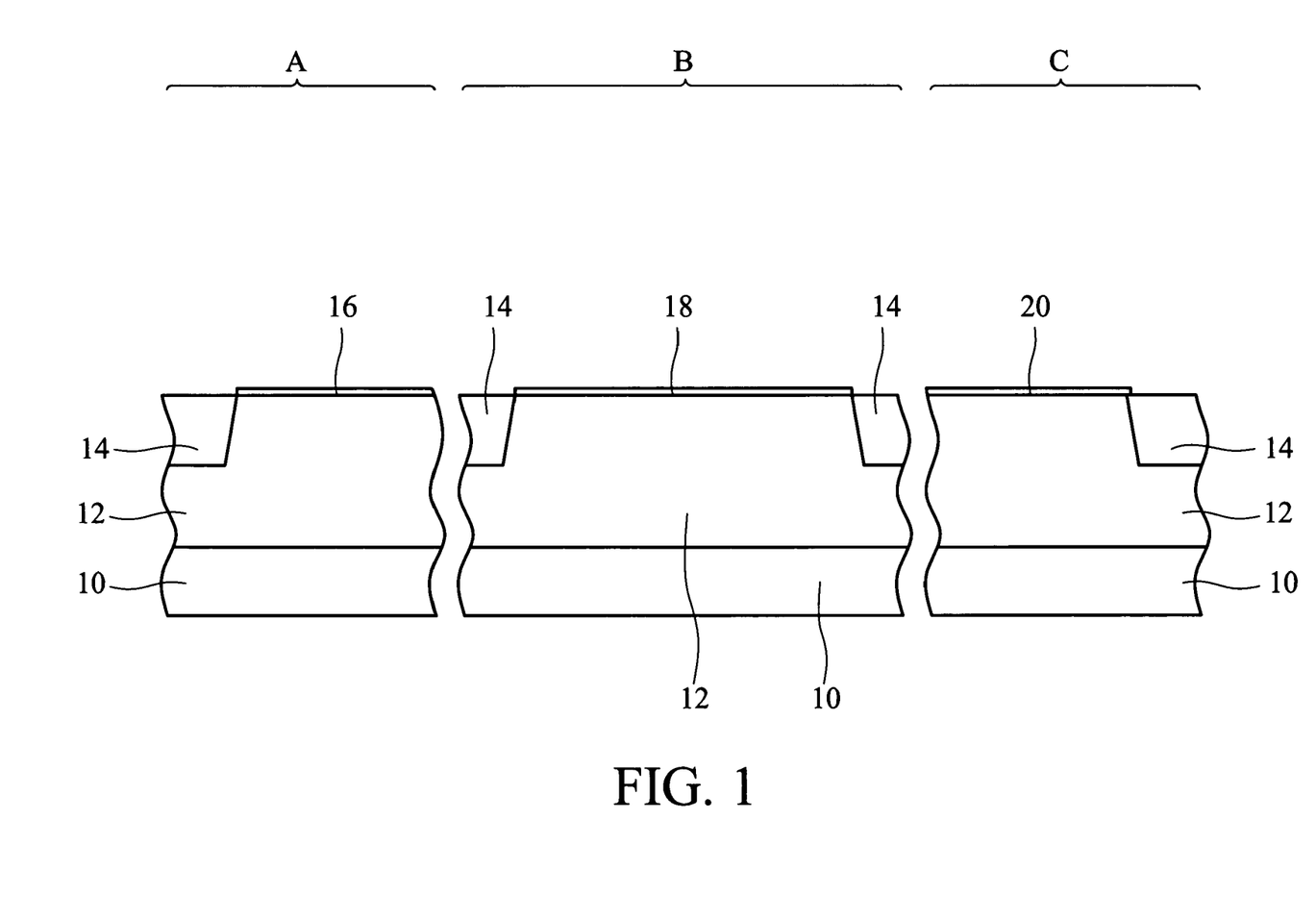
FIGS. 1 to 9 are schematic diagrams illustrating fabrication of a semiconductor device according to an embodiment of the invention.

As shown in FIG. 1, a substrate 10 is provided with a plurality of isolation structures 14 formed therein, thereby defining an input/output (I/O) area A, a memory cell area B and a core area C over the substrate 10. The substrate 10 is illustrated as a P substrate provided with an N well 12 therein here but is not limited thereto. The substrate 10 can also be a substrate utilizing other doping such as N type doping. The isolation structures 14 shown in FIG. 1 are illustrated as shallow trench isolations (STIs) but are not limited thereto. The isolation structures 14 can also be conventional field oxide (FOX) isolations. Next, gate dielectric layers 16, 18 and 20 are formed over the top surface of the substrate 10 exposed by the isolation structures 14. The gate dielectric layers 16, 18 and 20 illustrated in FIG. 1 have similar thicknesses but are not limited thereto. The gate dielectric layers 16, 18 and 20 can be formed by a process such as a convention triple-gate formation, thereby forming the gate dielectric layers 16, 18 and 20 with various thicknesses, respectively. Typically, the gate dielectric layer 16 in the I/O area A is formed with a relative thicker thickness and the gate dielectric layer 20 in the core area C is formed with a relative thinner thickness, both compared with the gate dielectric layer 18 formed in the memory cell area B. The gate dielectric layer 20 is preferably less than 25 Å and more preferably from about 12~22 Å. The gate dielectric layer 18 is preferably less than 46 Å and more preferably from about 25~35 Å. The gate dielectric layer 16 is preferably less than 80 Å and more preferably from about 50~70 Å. Gate dielectric layers 16, 18 and 20 may comprise silicon oxide, silicon oxynitride or other suitable dielectrics.

Figure 2:
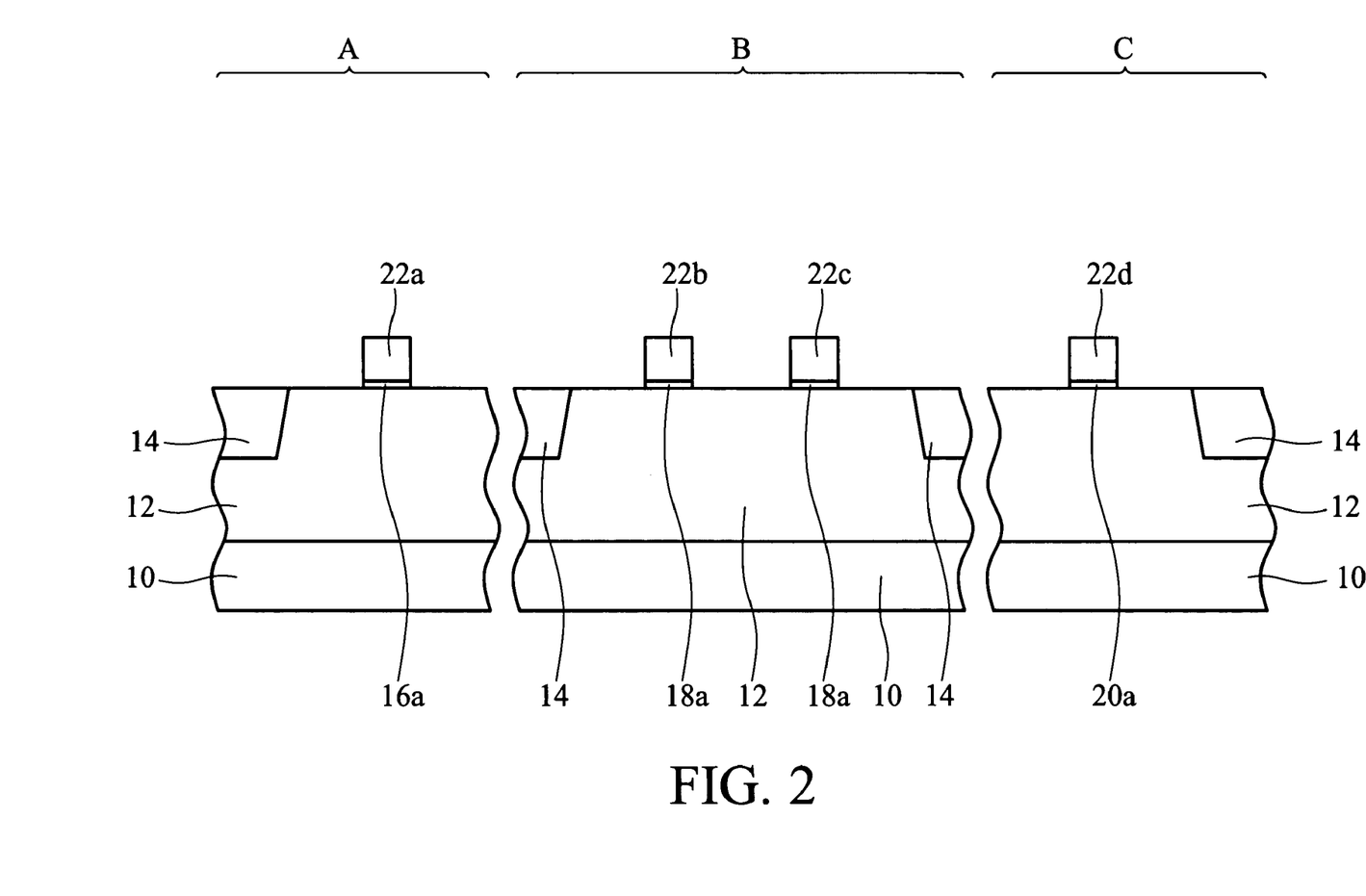

As shown in FIG. 2, a layer of conductive material is formed over the structure illustrated in FIG. 1. The layer of the conductive material and the gate dielectric layers 16, 18, and 20 are then patterned, thereby forming a gate conductor 22a overlying a patterned gate dielectric layer 16a in the I/O area A, a pair of gate conductors 22b and 22c respectively overlying a patterned gate dielectric layer 18a in the memory cell area B, and a gate conductor 22d overlying a patterned gate dielectric layer 20a in the core area C. The gate conductors 22a-d may comprise conductive materials such as polysilicon, metal, or combinations thereof. In FIG. 2, the gate conductors 22b and 22c formed in the memory cell area B may function as wordlines, the portion of substrate 10 between each of the gate conductors 22b-c in the memory cell area B and the adjacent isolation structure 14 may function as a location for forming storage node, and the portion of the substrate 10 between the conductive gates 22b and 22c may function as a location for bitline contact.

Figure 3:
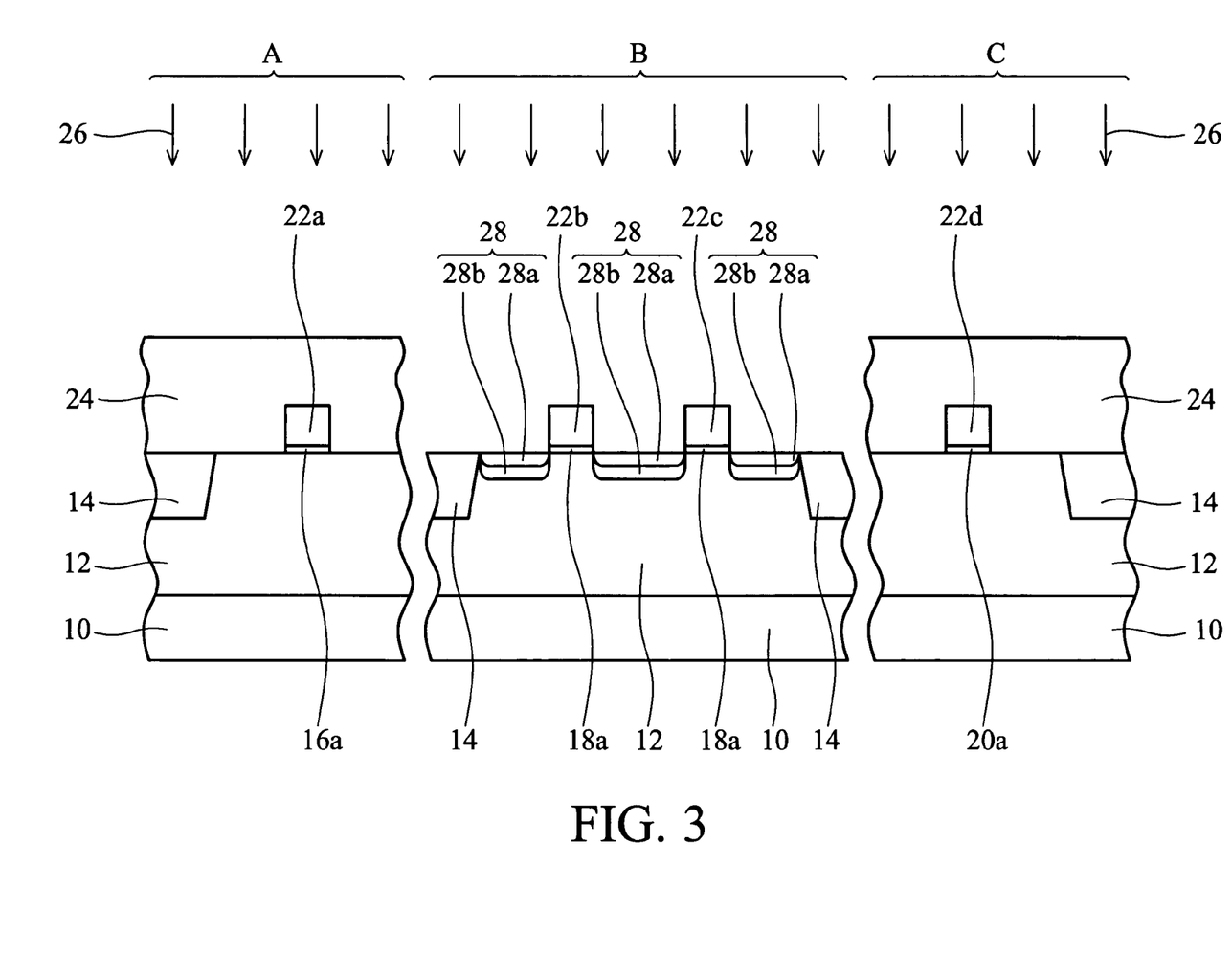

As shown in FIG. 3, a patterned resist layer 24 is formed over the structure illustrated in FIG. 2, exposing structures formed in the memory cell area B. An implant process 26 is then performed to implant ions into the substrate 10 in the memory cell area B exposed by the gate conductors 22, using the patterned resist layer 24 as an implant mask, thereby forming doping regions 28 therein. The implant process 26 may employ lightly-doped doping (LDD) step and a deeply-doped doping (DDD) step, wherein the LDD step can be optional. The implant process 26 is conducted perpendicular to the surface of the substrate 10 and employs, for example, P-type dopants such as boron (B) or $BF_2$. As shown in FIG. 3, each of the doping regions 28 is formed of, for example, a lightly-doped doping (LDD) region 28a and deeply-doped doping (DDD) region 28b. The lightly-doped doping (LDD) step of the implant process 26 is conducted to a concentration of preferably about 1e18-1e20 atoms/cm3 at an energy from about 4-10 KeV to respective depths within substrate 10 of preferably from about to 200-800 Å. The deeply-doped doping (DDD) step of the implant process 26 is conducted to a concentration of preferably for about 1e17-1e19 atoms/cm3 and at an energy from about 10-20 KeV to respective depths within substrate 10 of preferably from about to 1000-4000 Å.

Figure 4:
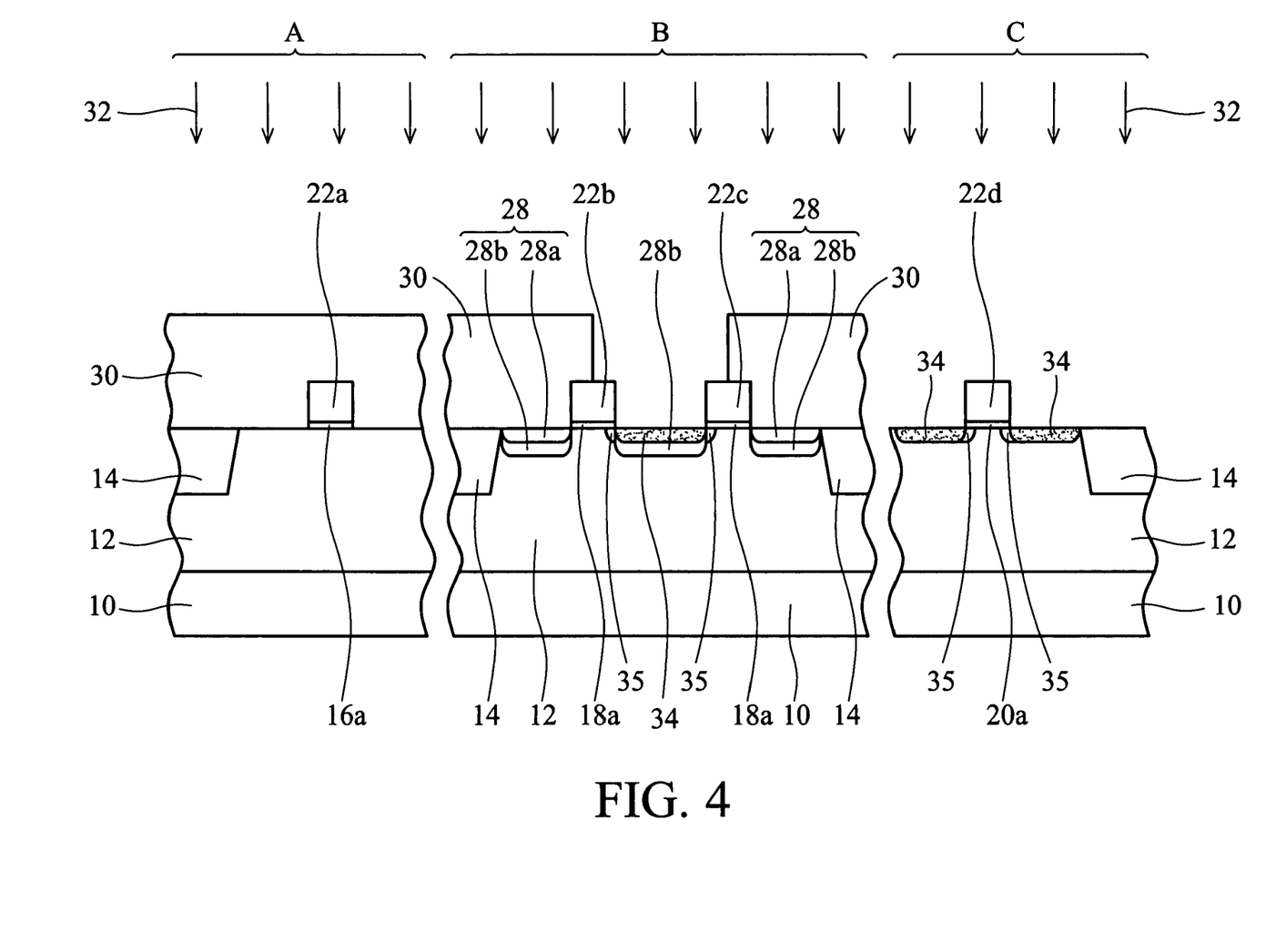

As shown in FIG. 4, after removal of the patterned resist layer 24 in FIG. 3, a patterned resist layer 30 is again formed over the remaining structure of FIG. 3, exposing structures in the core area C and portions of the substrate 10 between the gate conductors 22 for bitline contact in the memory cell area B. An implant process 32 then implants ions into the substrate 10 exposed by the above areas, using the patterned resist layer 30 as an implant mask, thereby forming doping regions 34 and 35 therein. The implant process 32 may employ a lightly-doped doping (LDD) step and a pocket implant step, wherein the lightly-doped doping (LDD) step is conducted perpendicular to the surface of the substrate 10 and employs, for example, P-type dopants such as boron (B) or $BF_2$. Thus, the doping regions 34 may function as a LDD region and the doping regions 35 may function as a pocket doping region. The pocket implant step employs N-type dopants such as As and P and the surface of the substrate 10 is angled at about 15-45° relative to the direction of the pocket implant. The lightly-doped doping (LDD) step of the implant process 32 is conducted to a concentration of preferably for about 1e19-1e21 atoms/cm3 and at an energy from about 1-5 KeV to respective depths within substrate 10 of preferably from about to 100-300 Å. The pocket implant step of the implant process 32 is conducted to a concentration of preferably about 1e18-1e20 atoms/cm3 and at energy from about 30-100 KeV to respective depths within substrate 10 of preferably from about to 500-1000 Å.

Figure 5:
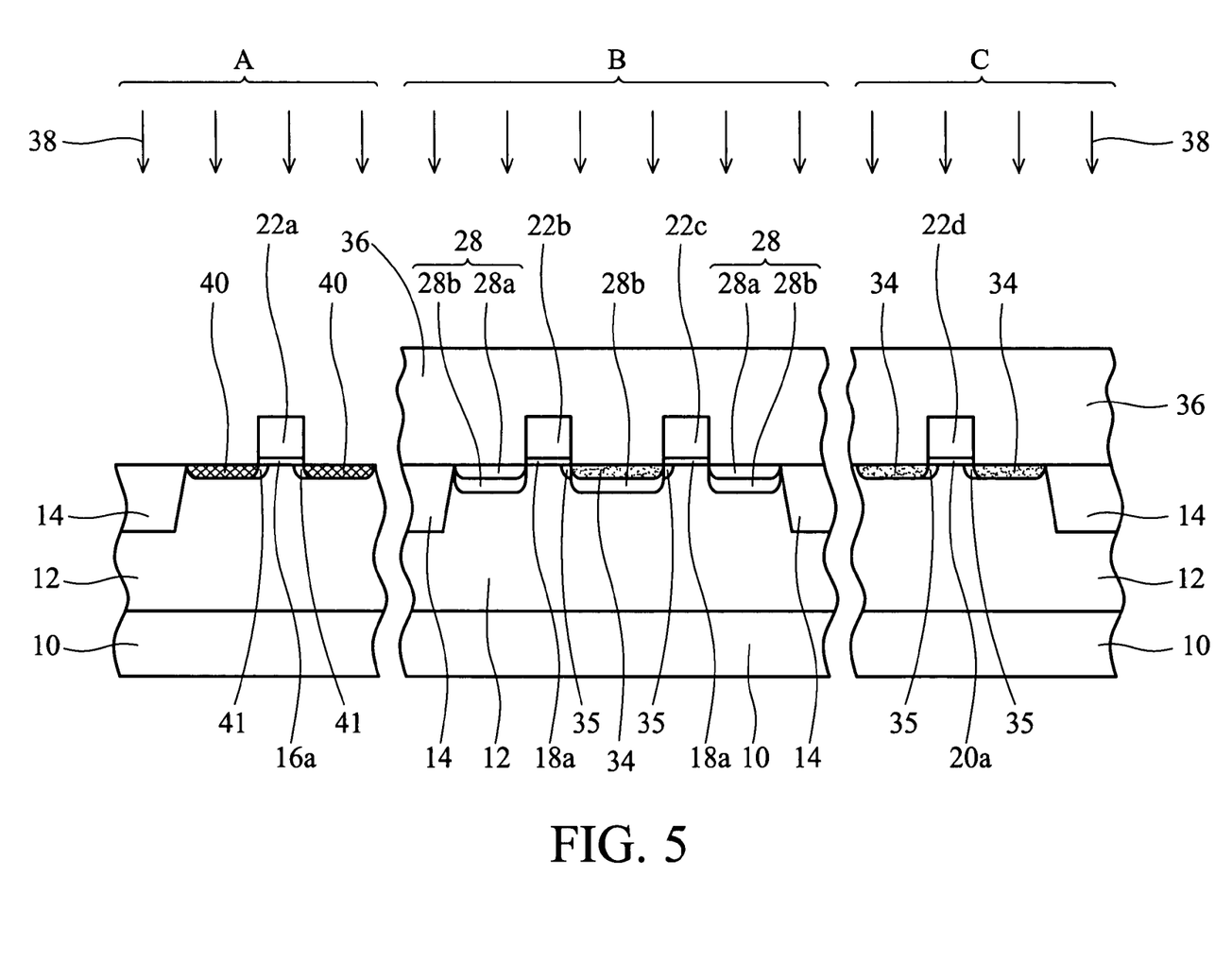

As shown in FIG. 5, after removal of the patterned resist layer 30 of FIG. 4, a patterned resist layer 36 is formed over the remaining structure of FIG. 4 and exposes structures in the I/O area A. An implant process 38 implants ions into the substrate 10 exposed by the gate conductors 22 in the I/O area A, using the patterned resist layer 36 as an implant mask, thereby forming doping regions 40 and 41 therein. The implant process 38 may employ a lightly-doped doping (LDD) step and an optional pocket implant step, wherein the lightly-doped doping (LDD) step and a pocket implant step are conducted perpendicular to the surface of the substrate 10 and employ, for example, P-type dopants such as boron (B) or $BF_2$. Thus, the doping regions 40 may function as a LDD region and the doping regions 41 may function as a pocket doping region, which can be optional formed. The lightly-doped doping (LDD) step of the implant process 38 conducted to a concentration of preferably about 1e19-1e21 atoms/cm$^3$ and at an energy from about 5-15 KeV to respective depths within substrate 10 of preferably from about to 200-800 Å and a pocket implant step of the implant process 38 conducted to a concentration of preferably about 1e18-1e20 atoms/cm$^3$ and at an energy from about 30-100 KeV to respective depths within substrate 10 of preferably from about to 500-1000 Å.

Figure 6:
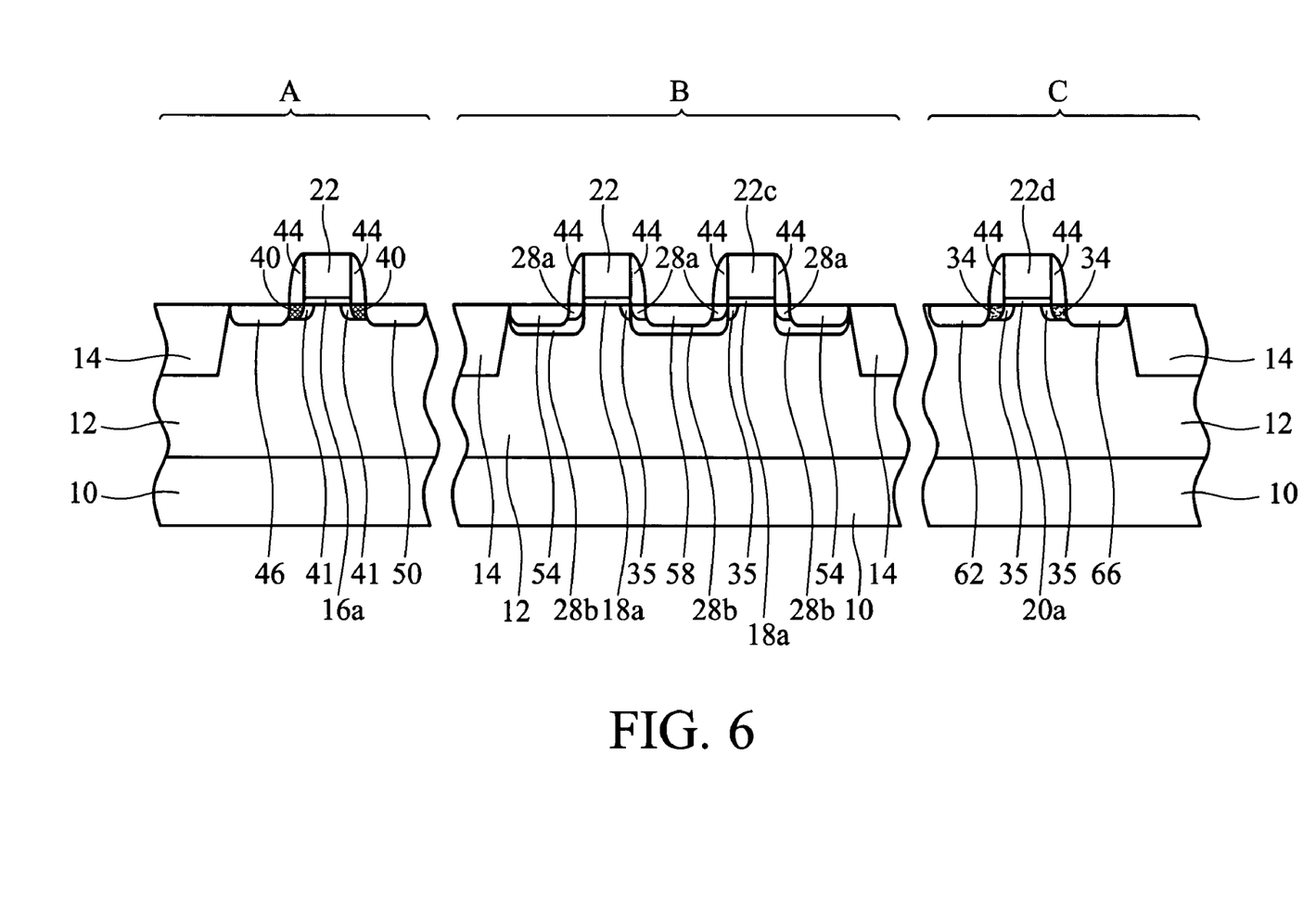

As shown in FIG. 6, after removal of the patterned resist layer 30 of FIG. 5, sidewall spacers 44 are formed on sidewalls of each of the gate conductors 22 and a source/drain implant step (not shown) is then performed on the portions of the substrate 10 not coved by the spacers 44. An annealing (not shown) such as rapid thermal or furnace annealing is next performed, thereby forming source/drain (S/D) regions 46 and 50 in the I/O area A, source regions 54 and drain region 58 in the memory cell area B, and source/drain region 62 and 66 in the core area C. In addition, LDD regions 40 are also formed in the I/O area A, adjacent to one of the source/drain regions 46 and 50. In the memory cell area B, LDD regions 28a are also formed adjacent the source regions 54 and pocket doping regions 35 are also formed adjacent to a side of the drain region 58, the pocket doping regions 35 doped with dopants of a conductivity type oppose that of the adjacent drain region 58. The source/drain implant step of the implant process 38 conducted to a concentration of preferably about 1e19-5e21 atoms/cm3 and at an energy from about 2-15 KeV to respective depths within substrate 10 of preferably from about 200 to 2000 Å. In the core area C, pocket doping regions 35 and LDD regions 34 are formed adjacent to the source/drain regions 62 and 66, preventing punch-through since the transistors formed therein are typically formed with a thinner gate dielectric layer. Thus, fabrication of transistors, such as the P-type transistors illustrated in FIG. 6, is complete. The sidewall spacers 44 may comprise nitride, silicon nitride, silicon oxide, silicon oxynitride, or composite oxide/nitride/oxide and can be formed by conventional spacer fabrication. In FIG. 6, the transistors formed in the memory cell area B are formed with asymmetric LDD structure and a pocket doping region of opposing conductivity type is formed adjacent to the drain region 58 of the transistors therein. P/N junction interfaces in the memory cell area B are thus reduced under consideration of punch-through of the transistors therein and leakage current adjacent to the source region 54 (where for storage node contacting) can be thus reduced.

Figure 7:
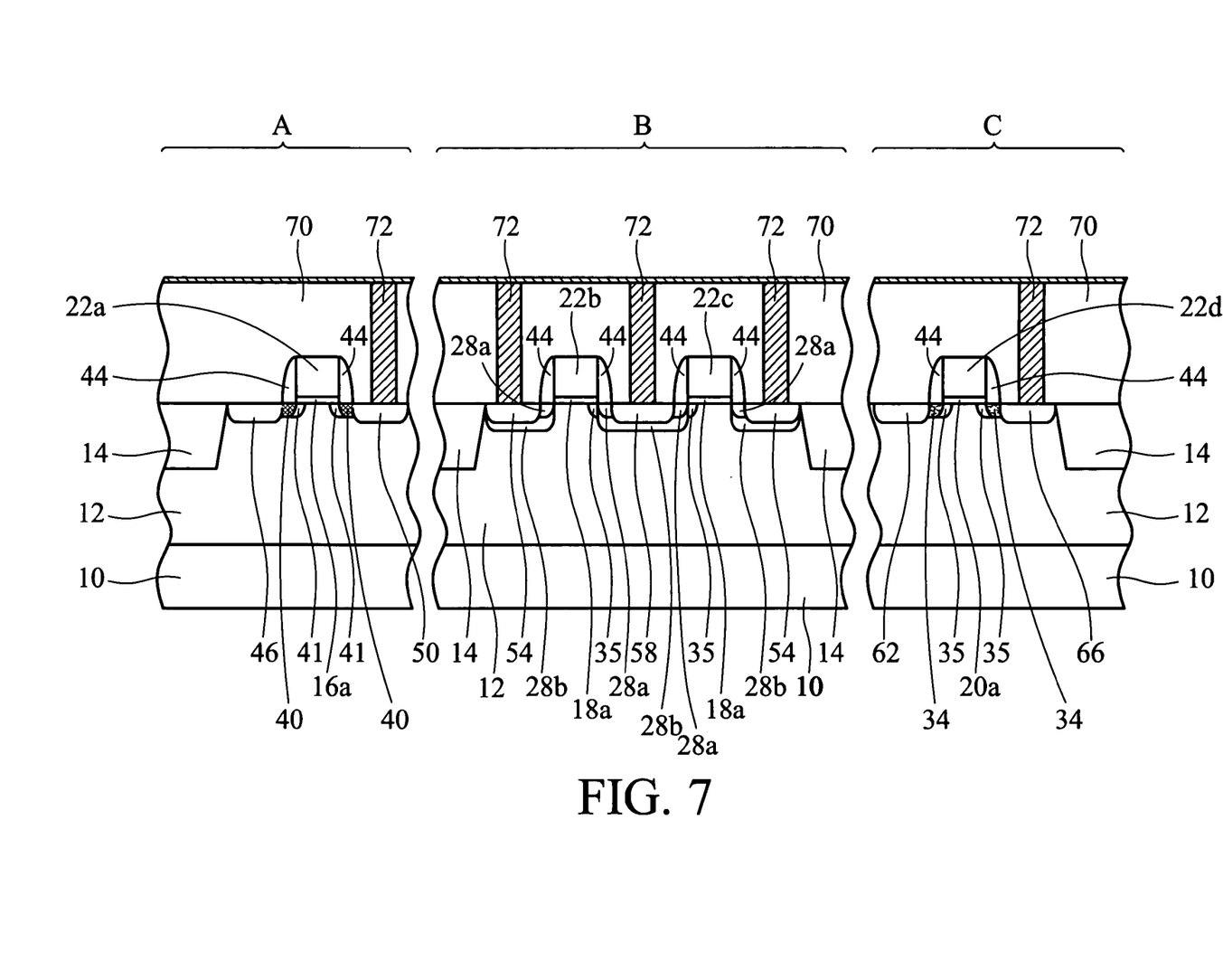

As shown in FIG. 7, an inter-layer dielectric (ILD) layer 70 is next formed over the structure illustrated in FIG. 6. Conductive plugs 72 such as tungsten plugs are then respectively formed in the inter-layer dielectric layer 70 by conventional plug fabrication at proper locations in the I/O area A, the memory cell area B and the core area C. In FIG. 7, the conductive plugs are respectively formed substantially over a source/drain region but are not limited thereto, electrically contacting an underlying source/drain region. Next, an etching stop layer 74 is formed over the ILD layer 70 and covers the conductive plugs 72.

Figure 8:
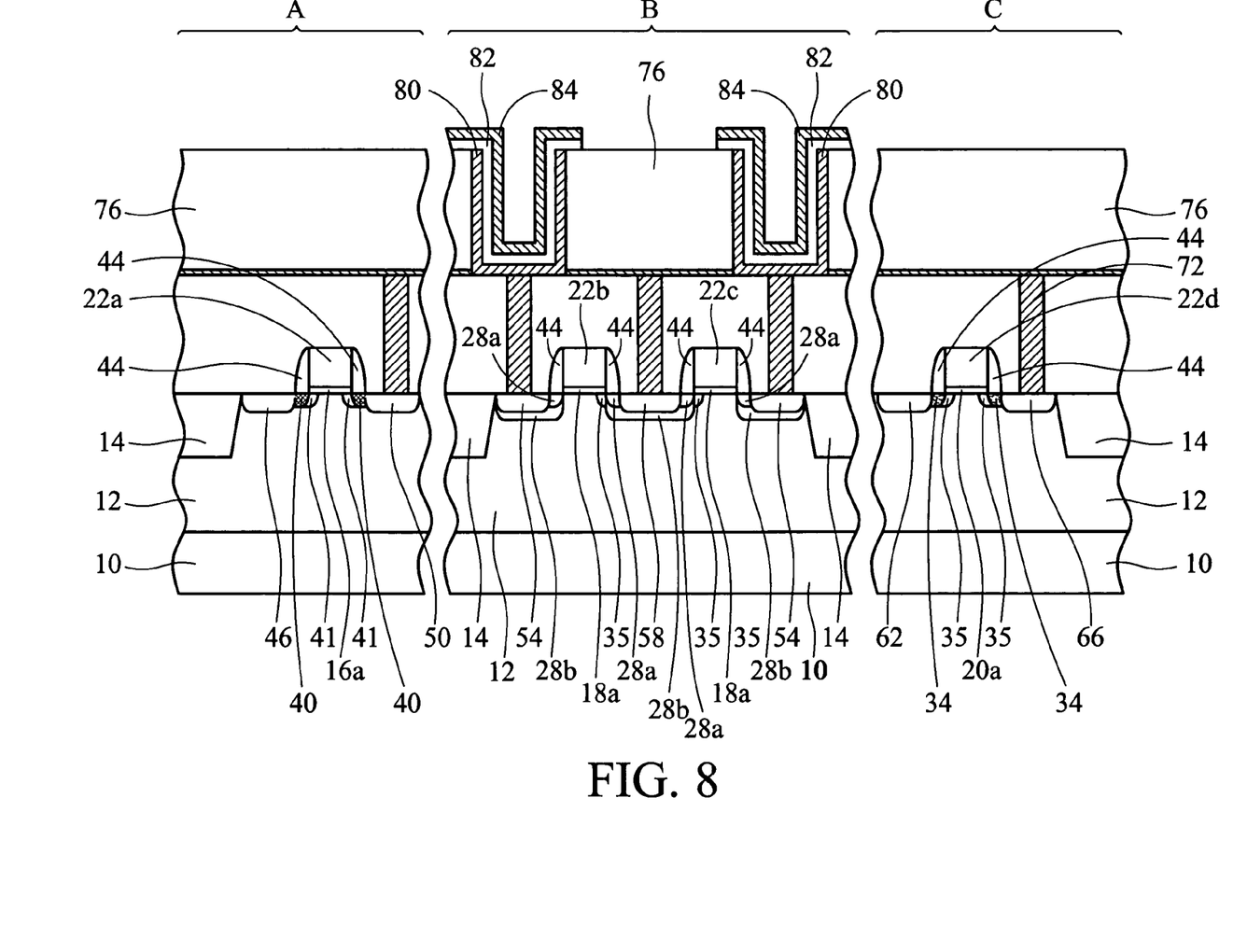

As shown in FIG. 8, another ILD layer 76 is formed over the structure illustrated in FIG. 7. The portion of the dielectric layer 76 in the memory cell region B is then defined to form openings therein, with storage capacitors then formed in each opening. As shown in FIG. 8, the storage capacitors are illustrated as MIM capacitors comprising a first metal layer 80, a dielectric layer 82 and a second metal layer 84. Fabrication and materials of the MIM capacitor are well known and are not discussed here in detail. Each of the MIM capacitors is connected to a conductive plug 72 thereunder, thereby forming a conductive path to an underlying transistor through the conductive plug.

Figure 9:
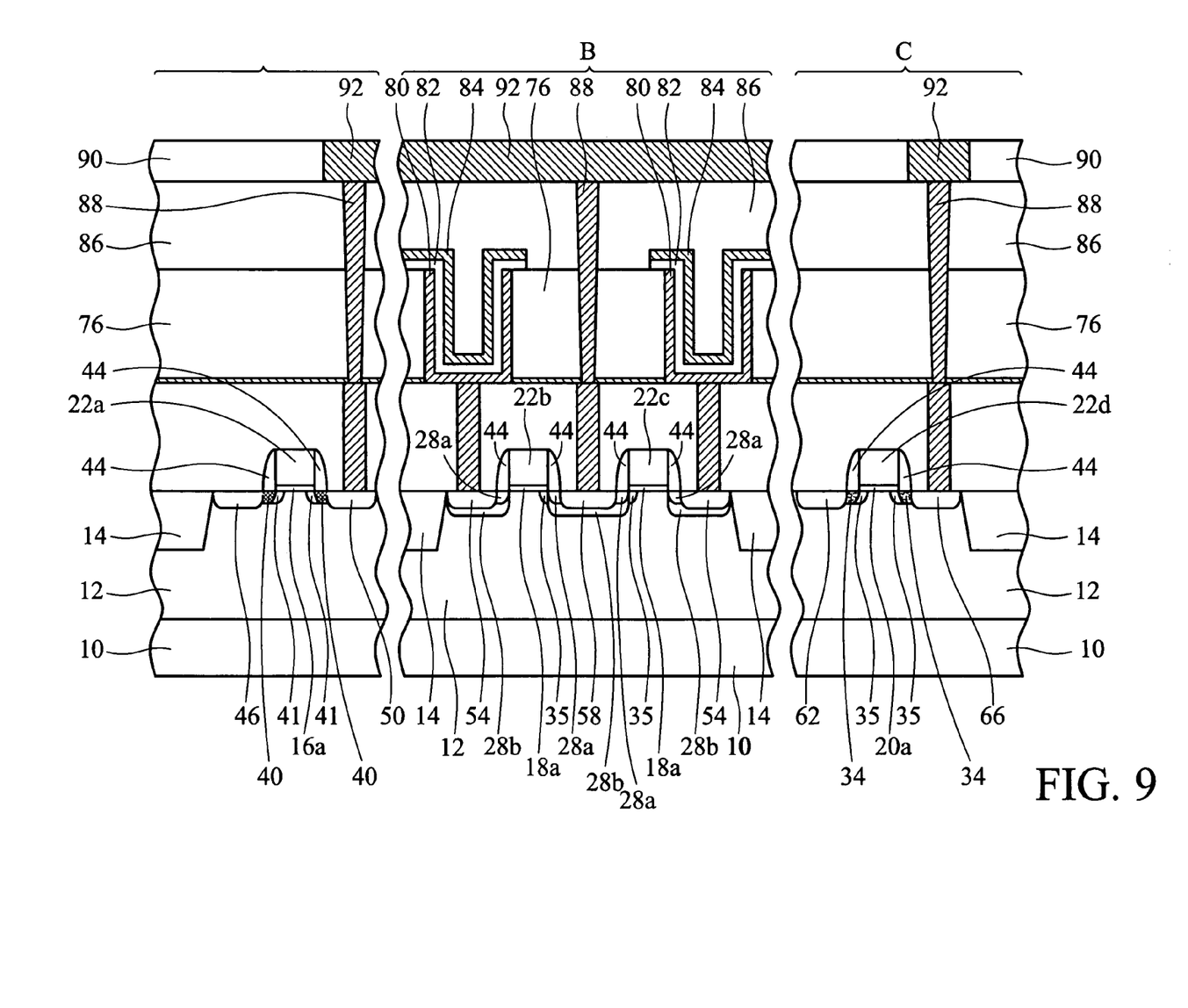

As shown in FIG. 9, inter-metal dielectric (IMD) layers 86 and 90 are formed over the structure illustrated in FIG. 8, respectively having conductive interconnect components 88 and 92 formed therein. The conductive components 88 formed in the IMD layer 86 further penetrate downward through the underlying ILD layer 76 and the etching stop layer 74 to contact the conductive plug 72 over a drain region 58 in the memory cell area B and the source/drain regions 46 and 50 in the I/O area A and 62 and 66 in the core area C, respectively. The conductive interconnect components 92 formed in the IMD layer 90 may function as a conductive line. The conductive interconnect components 92 formed in the memory cell area B may function as a bitline, connecting the underlying conductive plug 72 since the underlying drain region 58 functions as a location for bitline contact. Thus, a SoC semiconductor device, as the semiconductor device illustrated in FIG. 9, having multiple subsystems formed on a substrate or a chip is fabricated. It is noted that since all of the capacitors in the memory cell area B are formed overlying the transistors, a more compact integration of the memory cell area can thus be achieved, increasing capacitors formed in the memory cell area B. In addition, since a pocket doping region 35 is formed adjacent to the drain region 58 of a transistor in the memory cell region B but not adjacent to the source region 54 therein, undesired P/N junction is reduced in the memory cell area B and junction leakage induced by such P/N junction formed adjacent to the source region can be prevented, thereby reducing cell leakages in the storage node and enhancing retention time of a capacitor, such as the MIM capacitor overlying the transistor illustrated in FIG. 9. Memory cell leakage of the capacitors in the memory cell area is thus reduced with the transistor size-reduction and memory cell integration also increased.

While the invention has been described by way of example and in terms of preferred embodiment, it is to be understood that the invention is not limited to the thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device, comprising:
   providing a substrate with a well region therein;
   forming a gate stack over a portion of the well region in the memory cell and core areas, respectively, wherein the gate stack comprises an overlying gate conductor and an underlying gate dielectric;
   masking the core area by a first patterned resist layer, exposing the memory area;
   forming a lightly-doped drain (LDD) region and a deelply-doped drain (DDD) region on portions the well region exposed by the gate stack in the memory cell area;
   removing the first patterned resist layer and masking portions of the memory cell area by a second patterned resist layer, exposing a portion of the well region adjacent to a drain side of the gate stack in the memory cell area and both sides of the gate stack in the core area;
   forming a lightly-doped drain (LDD) region and a pocket region in the well region exposed by the gate stacks in the core area and the memory cell area, wherein the pocket region is formed by implanting dopants of the first conductivity type with a concentration of about $1 \times 10^{18}$-$1 \times 10^{20}$ atoms/cm$^3$ at an angle to the surface of the well region using the second patterned resist layer as an implant mask;
   removing the second patterned resist layer;
   forming spacers on opposing sidewalls of each of the gate stack in the memory cell and core areas; and
   forming a source/drain region in the well region at opposing sides of the well region exposed by the gate stacks and the spacers in the core and memory cell areas, wherein the source/drain region is formed with second conductivity type different from the first conductivity type;
   wherein the gate stack in the core area is formed with a source/drain region having a lightly-doped source/drain region adjacent thereto in the well region on opposing sides thereof and the gate stack in the memory area is formed with a source/drain region with a lightly-doped source/drain region in the well region adjacent thereto and further a pocket doping region adjacent to the lightly-doped source/drain region at a drain side.

2. The method as claimed in claim 1, further comprising:
   forming a first dielectric layer over the substrate, covering the transistor formed in the first, second and third areas;
   forming a plurality of first contact plugs through the first dielectric layer, thereby electrically connecting a source region and a drain region of the transistor in the second area, respectively;
   forming a second dielectric layer over the first dielectric layer;
   forming a capacitor in portions of the second dielectric layer in the second area, wherein the capacitor electrically connects one of the first contact plugs;
   forming a third dielectric layer over the second dielectric layer, covering the capacitor;
   forming a second contact plug through the third and second dielectric layers, electrically contacting one of the first contact plugs; and
   forming a bitline over the third dielectric layer, electrically contacting the second contact plug.

3. The method as claimed in claim 2, wherein the first area is an input/output (I/O) area, the second area is a memory cell area and the third area is a core area.

4. The method as claimed in claim 2, wherein the second contact plug and the first contact plug contacted thereto forms a bitline contact electrically contacting the drain region thereunder.

5. The method as claimed in claim 1, wherein the LDD and DDD implantations implant dopants of the second conductivity type into the well region, wherein the second conductivity type is different from the first conductivity type.

6. The method as claimed in claim 1, wherein the capacitor electrically connects the first contact plug electrically contacting the source region thereunder.

* * * * *